(12) United States Patent
Kim et al.

(10) Patent No.: US 9,520,561 B1
(45) Date of Patent: Dec. 13, 2016

(54) CONTROLLING ON-STATE CURRENT FOR TWO-TERMINAL MEMORY

(71) Applicant: Crossbar, Inc., Santa Clara, CA (US)

(72) Inventors: Kuk-Hwan Kim, San Jose, CA (US); Ping Lu, Sunnyvale, CA (US); Chen-Chun Chen, Fremont, CA (US); Sung Hyun Jo, Sunnyvale, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 14/798,074

(22) Filed: Jul. 13, 2015

Related U.S. Application Data

(62) Division of application No. 13/910,402, filed on Jun. 5, 2013, now Pat. No. 9,093,635.

(60) Provisional application No. 61/785,945, filed on Mar. 14, 2013.

(51) Int. Cl.
| | |
|---|---|
| *H01L 47/00* | (2006.01) |
| *H01L 29/04* | (2006.01) |
| *H01L 21/00* | (2006.01) |
| *H01L 21/20* | (2006.01) |
| *H01L 45/00* | (2006.01) |

(52) U.S. Cl.
CPC .......... *H01L 45/1608* (2013.01); *H01L 45/06* (2013.01); *H01L 45/08* (2013.01); *H01L 45/12* (2013.01); *H01L 45/1233* (2013.01); *H01L 45/145* (2013.01); *H01L 45/146* (2013.01); *H01L 45/148* (2013.01)

(58) Field of Classification Search
CPC ...... H01L 45/1608; H01L 45/06; H01L 45/08; H01L 45/12; H01L 45/1233; H01L 45/145; H01L 45/148; H01L 45/146; G11C 13/004

USPC .............. 257/4, 59, 324; 438/104, 381, 133
See application file for complete search history.

(56) References Cited

U.S. PATENT DOCUMENTS

| | | |
|---|---|---|
| 6,939,787 B2 | 9/2005 | Ohtake et al. |
| 7,102,150 B2 | 9/2006 | Harshfield et al. |
| 7,648,896 B2 | 1/2010 | Herner |
| 7,800,932 B2 | 9/2010 | Kumar et al. |
| 7,948,010 B2 | 5/2011 | Reshotko et al. |
| 7,968,419 B2 | 6/2011 | Li et al. |
| 8,088,688 B1 | 1/2012 | Herner |
| 8,441,835 B2 | 5/2013 | Jo et al. |
| 8,587,989 B2 | 11/2013 | Manning et al. |
| 8,658,476 B1 | 2/2014 | Sun et al. |
| 2005/0062045 A1 | 3/2005 | Bhattacharyya |
| 2005/0260826 A1 | 11/2005 | Dupuis et al. |

(Continued)

FOREIGN PATENT DOCUMENTS

| | | |
|---|---|---|
| EP | 2405441 A1 | 1/2012 |
| WO | 2010042732 A2 | 4/2010 |

OTHER PUBLICATIONS

Office Action dated May 20, 2013 for U.S. Appl. No. 13/725,331, 28 Pages.

(Continued)

*Primary Examiner* — Dzung Tran
(74) *Attorney, Agent, or Firm* — Amin, Turocy & Watson, LLP

(57) ABSTRACT

Provision of fabrication, construction, and/or assembly of a memory device including a two-terminal memory portion is described herein. The two-terminal memory device fabrication can provide enhanced capabilities in connection with precisely tuning on-state current over a greater possible range.

20 Claims, 11 Drawing Sheets

(56) References Cited

U.S. PATENT DOCUMENTS

| | | |
|---|---|---|
| 2006/0292301 A1 | 12/2006 | Herner |
| 2007/0087508 A1 | 4/2007 | Herner |
| 2007/0090425 A1 | 4/2007 | Kumar et al. |
| 2007/0105284 A1 | 5/2007 | Herner |
| 2007/0228414 A1 | 10/2007 | Kumar et al. |
| 2008/0090337 A1* | 4/2008 | Williams ........... G11C 13/0009 438/133 |
| 2008/0106972 A1 | 5/2008 | Liang et al. |
| 2008/0185567 A1 | 8/2008 | Kumar et al. |
| 2008/0278990 A1 | 11/2008 | Kumar et al. |
| 2008/0311722 A1 | 12/2008 | Petti et al. |
| 2009/0001347 A1 | 1/2009 | Kumar et al. |
| 2009/0026582 A1 | 1/2009 | Herner |
| 2009/0095951 A1 | 4/2009 | Kostylev et al. |
| 2009/0140232 A1* | 6/2009 | Ufert ................... H01L 27/2436 257/4 |
| 2009/0256129 A1* | 10/2009 | Scheuerlein ........ H01L 27/2409 257/4 |
| 2009/0256130 A1* | 10/2009 | Schricker ........... G11C 13/0009 257/4 |
| 2009/0258489 A1 | 10/2009 | Chen et al. |
| 2009/0298224 A1 | 12/2009 | Lowrey |
| 2010/0012914 A1 | 1/2010 | Xu et al. |
| 2010/0019221 A1 | 1/2010 | Lung et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0102290 A1 | 4/2010 | Lu et al. |
| 2010/0110758 A1 | 5/2010 | Li et al. |
| 2010/0157710 A1* | 6/2010 | Lambertson ............ G11C 11/36 365/218 |
| 2010/0237314 A1* | 9/2010 | Tsukamoto ......... G11C 11/5678 257/3 |
| 2011/0006275 A1 | 1/2011 | Roelofs et al. |
| 2011/0133149 A1* | 6/2011 | Sonehara ........... G11C 13/0002 257/3 |
| 2011/0136327 A1 | 6/2011 | Han et al. |
| 2011/0205782 A1 | 8/2011 | Costa et al. |
| 2011/0305064 A1* | 12/2011 | Jo ....................... G11C 13/0002 365/148 |
| 2011/0310655 A1 | 12/2011 | Kreupl et al. |
| 2011/0317470 A1 | 12/2011 | Lu et al. |
| 2012/0008366 A1* | 1/2012 | Lu ....................... G11C 13/0002 365/148 |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | DeLucca et al. |
| 2012/0043518 A1 | 2/2012 | Cheng et al. |
| 2012/0043519 A1 | 2/2012 | Jo et al. |
| 2012/0108030 A1 | 5/2012 | Herner |
| 2012/0176831 A1 | 7/2012 | Xiao et al. |
| 2012/0298947 A1 | 11/2012 | Clark |
| 2013/0020548 A1 | 1/2013 | Clark et al. |
| 2013/0168629 A1 | 7/2013 | Ribeiro et al. |

OTHER PUBLICATIONS

Office Action dated Sep. 30, 2013 for U.S. Appl. No. 13/189,401, 42 Pages.
Notice of Allowance dated Oct. 10, 2013 for U.S. Appl. No. 13/452,657, 39 Pages.
Office Action dated Apr. 5, 2012 for U.S. Appl. No. 12/833,898, 17 Pages.
European Search Report for European Application No. EP11005207.3 dated Oct. 26, 2011, 5 Pages.
Notice of Allowance dated May 30, 2012 for U.S. Appl. No. 12/833,898, 10 Pages.
Notice of Allowance dated Oct. 5, 2011 for U.S. Appl. No. 12/940,920, 14 Pages.
Office Action dated Mar. 27, 2012 for U.S. Appl. No. 13/314,513, 7 Pages.
Office Action dated Jan. 20, 2015 for U.S. Appl. No. 13/189,401, 20 Pages.
European Search Report for European Patent Application No. 11870128.3 dated Apr. 2, 2015, 5 Pages.
Office Action dated Oct. 23, 2012 for U.S. Appl. No. 13/314,513, 25 Pages.
Office Action dated Feb. 6, 2015 for U.S. Appl. No. 14/188,622, 48 Pages.
Office Action dated Sep. 22, 2014 for U.S. Appl. No. 13/189,401, 26 Pages.
Office Action dated Apr. 17, 2015 for U.S. Appl. No. 13/733,843, 29 Pages.
Jo, et al., "CMOS Compatible Nanoscale Nonvolatile Resistance Switching Memory," Nano Letters, 2008, pp. 392-397, vol. 8, No. 2, 6 Pages.
European Office Action for European Patent Application No. 11870128.3 dated Apr. 21, 2015, 1 Page.
Office Action dated Aug. 29, 2014 for U.S. Appl. No. 13/910,402, 74 Pages.
Office Action dated Sep. 2, 2015 for U.S. Appl. No. 13/733,843, 21 Pages.
Office Action dated Oct. 7, 2015 for U.S. Appl. No. 14/188,622, 40 Pages.
European Search Report for European Application No. EP14000951 dated Mar. 2, 2015, 7 Pages.

* cited by examiner

CONTROLLING ON-STATE CURRENT FOR TWO-TERMINAL MEMORY

CROSS-REFERENCES TO RELATED APPLICATIONS

This present application for patent is a division of U.S. patent application Ser. No. 13/910,402 entitled "CONTROLLING ON-STATE CURRENT FOR TWO-TERMINAL MEMORY" and filed Jun. 5, 2013, which claims the benefit of priority to U.S. Application No. 61/785,945, filed on Mar. 14, 2013, each of which are hereby incorporated by reference herein in their respective entireties and for all purposes.

TECHNICAL FIELD

This disclosure generally relates to semiconductor fabrication, and more particularly to two-terminal memory formed on a substrate such as complementary metal oxide semiconductor (CMOS) with a mechanism for controlling on-state (e.g., programmed state) current through a resistive layer included in the two-terminal memory.

BACKGROUND

The inventors of the present invention have recognized that resistive random access memory (RRAM) provides several advantages over competing memory technologies. Therefore, it can be particularly advantageous to form an RRAM-based memory device on top of a complementary metal oxide semiconductor (CMOS). However, in order to build an RRAM device on a CMOS framework, the RRAM device typically needs to be constructed in connection with a relatively low-temperature process, which introduces some issues with respect to constructing the RRAM.

A difficulty faced by the inventors, associated with building such an RRAM device is precisely controlling current through the RRAM device when the device is in the on-state. Some of the approaches considered by the inventors have tended to include in the RRAM a positive or p-type semiconductor material that acts as a resistive layer to control the on-state current. This resistive layer could be constructed of silicon or silicon germanium in an amorphous phase. The amorphous phase is sometimes preferred over a polycrystalline phase because electrical breakdown voltage of an amorphous material is higher than that of a polycrystalline material. As such, the inventors have recognized that an amorphous material can hold larger voltages and therefore can provide more reliable RRAM device operation.

Unfortunately, it is very difficult to tune the resistance of an amorphous material due to the relatively low electron mobility associated with such amorphous materials. As a result, it is also very difficult to control the current through the RRAM device.

In light of the above, what is desired are methods and apparatus to control on-state current of a resistive random access memory, without the drawbacks described above.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Apparatuses disclosed herein relate to a memory device with a two-terminal memory layer on a substrate layer. For example, the substrate layer can be complementary metal oxide semiconductor (CMOS) layer (e.g., a semiconductor material having one or more CMOS devices formed therein or thereon) and the two-terminal layer can be a resistive random access memory (RRAM) layer. The two-terminal layer can comprise an active metal layer, a resistive switching material layer (RSML), a resistive layer, and an ohmic contact layer. The resistive layer can comprise a first semiconductor material in a polycrystalline phase situated on top of a second semiconductor material in an amorphous phase.

Systems disclosed herein relate to fabricating a resistive layer in accordance with a desired on-state current. For example, a fabrication component can facilitate fabrication of a memory device comprising a substrate layer and a two-terminal memory layer. A receiving component can receive resistance data associated with a target on-state resistance for a resistive layer included in the two-terminal memory layer. A computation component can determine a target thickness of the resistive layer as a function of the resistance data.

Methods disclosed herein relate to fabricating a memory device with a two-terminal memory portion that has a composite resistive layer for tuning on-state current, e.g., by a system including a processor. Such can be accomplished by facilitating formation of the two-terminal memory layer atop a substrate layer and facilitating, in the two-terminal memory layer, inclusion of an active metal layer, an RSML, a resistive layer, and an ohmic contact layer. The resistive layer can be fabricated by facilitating inclusion of a first semiconductor material layer in a polycrystalline phase (e.g., ohmic contact layer) and facilitating inclusion of a second semiconductor material layer in an amorphous phase (e.g., resistive contact layer).

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Overview

Figure 1:
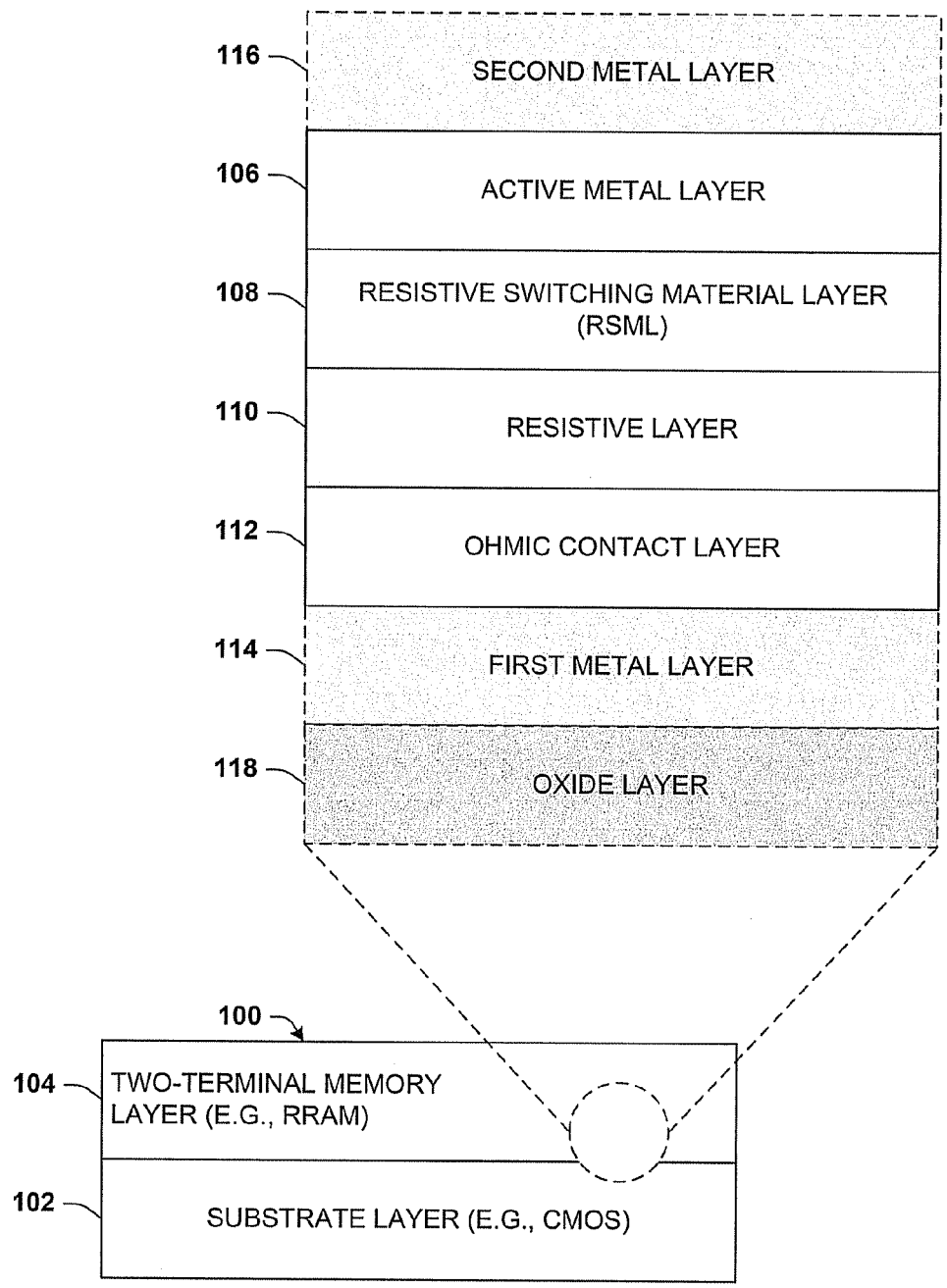
FIG. 1 illustrates a block diagram of an example memory device with a two-terminal memory portion that can include a composite layer for enhanced control of on-state current in accordance with certain embodiments of this disclosure.

This disclosure relates to two-terminal memory, one example of which can be resistive-switching memory. The inventors believe that resistive-switching memory provides several advantages over competing memory technologies. Therefore, it can be beneficial to form a resistive-switching-based memory device (or another two-terminal memory device) on top of a complementary metal oxide semiconductor (CMOS). However, in order to build a memory device on a CMOS framework, the memory device typically needs to be constructed in connection with a relatively low-temperature process, which introduces some issues with respect to constructing the memory device.

One difficulty associated with building such a memory device is precisely controlling current through the device when the device is in the on-state. Previous approaches tend to include in the memory device a p-type (positive) semiconductor material that acts as a resistive layer to control the on-state current. This resistive layer is typically constructed of silicon or silicon germanium in an amorphous phase. In some embodiments, the amorphous phase is preferred over a polycrystalline phase because electrical breakdown voltage of an amorphous material is higher than that of a polycrystalline material. As such, an amorphous material can hold larger voltages and therefore provides more reliable memory device operation.

Unfortunately, in some embodiments, it can be difficult to tune the resistance of an amorphous material due to the relatively low electron mobility associated with such amorphous materials. As a result, it can also be difficult to control the current through the memory device.

For example, in various embodiments, a two-terminal memory device, such as an RRAM device, may include a resistive layer composed of a layer of an amorphous material. The resistive layer serves as an on-state current control layer. In particular, in the on-state, when a conductive filament is formed in a resistive switching material layer (RSML) that is situated above (e.g., adjacent or proximate to) the resistive layer, the resistive layer then acts as a series resistor to control the on-state current. The resistivity and/or resistance of the resistive layer can therefore regulate the on-state current. However, it is very difficult to tune the resistivity of amorphous materials.

Embodiments of this disclosure relate to constructing a two-terminal memory device in which the resistive layer is composed of multiple layers and/or distinct materials in order to provide more precise control of, and/or a broader available range for, the resistance and/or on-state current associated with the resistive layer of the two-terminal memory device. In some embodiments, the resistive layer can include a p-type resistive material in an amorphous phase. In addition, the resistive layer can further include a p-type conductive material in a polycrystalline phase.

In various embodiments, due to inherent characteristics detailed herein, the thickness of the polycrystalline phase material has a substantial impact on the resistance of the resistive layer. This thickness can be adjusted to tune the resistance or other characteristics of the resistive layer and such can be accomplished according to a low-temperature process such that the two-terminal memory device can be fabricated on top of a given substrate such as complementary metal oxide (CMOS) layer.

Example Two

Terminal Memory Device with Composite Resistive Layer for Controlling on-State Current This disclosure relates to two-terminal memory cells, which can include resistive switching two-terminal memory cells, in various embodiments. Resistive switching two-terminal memory cells (also referred to as resistive switching memory cells), as utilized herein, includes circuit components having two electrical contacts (also referred to herein as electrodes or terminals) with an active region between the two conductive contacts. In various embodiments, the active region of the two-terminal memory device exhibits a plurality of stable or semi-stable resistive states, each resistive state having different electrical characteristics (e.g. resistance). For example, respective ones of the plurality of states can be formed or activated in response to a respective voltage difference applied at the two conductive contacts. An example of a resistive switching two-terminal memory device, though not exhaustive, can include a resistive random access memory (RRAM).

Embodiments of the subject disclosure are typically based upon a filamentary-based memory cell. One example of a filamentary-based memory cell can comprise: a contact layer, e.g., a p-type or n-type silicon bearing layer (e.g., p-type or n-type polysilicon, p-type or n-type silicon germanium (SiGe), or the like, a resistive switching material layer (RSML) and an active metal layer for providing filament forming ions to the RSML.

The contact layer, e.g., p-type or n-type silicon bearing layer can include a p-type or n-type polysilicon, p-type or n-type SiGe, or the like. The RSML can include either one or a combination of, an undoped amorphous silicon layer, a semiconductor layer having intrinsic characteristics, a silicon sub-oxide SiOx, an amorphized silicon layer, and so forth. Examples of the active metal layer can include, among others: silver (Ag), gold (Au), titanium (Ti), nickel (Ni), aluminum (Al), chromium (Cr), iron (Fe), manganese (Mn), tungsten (W), vanadium (V), cobalt (Co), platinum (Pt), and palladium (Pd)). Other suitable conductive materials, as well as compounds or combinations of the foregoing can be employed for the active metal layer in some aspects of the subject disclosure. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

It should be appreciated that a variety of two-terminal memory cell technologies exist, many having different physical properties. For instance, some embodiments of the subject disclosure can have different discrete programmable resistances, different associated program/erase voltages, as well as other differentiating characteristics. For instance, in a unipolar embodiment, once a memory cell is initially programmed, the memory cell can be later programmed in response to a first positive voltage (e.g., three volts) and erased in response to a second positive voltage (e.g., between four and five volts). Other embodiments can alternatively exhibit bipolar characteristics, and become programmed in response to a positive voltage and erased in response to a negative voltage. Where an embodiment does not specify a unipolar or bipolar characteristic, or does not indicate suitable program/erase voltages, it is intended that such aspects and embodiments incorporate any suitable memory cell technology and be operated by program/erase voltages appropriate to that memory cell technology, as would be known by one of ordinary skill in the art or made known by way of the context provided herein.

It should be appreciated further that where substituting a different memory cell technology that would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. Many of these devices include materials that are incompatible with many common CMOS fabrication processes. Accordingly, expensive fabrication overhead costs (e.g., retooling, redesign, retesting, etc.) are projected in association with producing these devices. In addition, these devices can exhibit relatively slow switching speeds, small on/off resistance ratios (e.g., leading to small sensing margin) or poor thermal stability, as well as other problems.

Compatibility with CMOS fabrication processes is anticipated by the inventors of the present disclosure to be a significant factor related to fabrication cost reduction for new types of electronic memory. Some proposed resistive-switching memory cells are constrained by CMOS fabrication constraints, including process temperature(s), memory cell material(s), wiring or electrode material(s), memory cell material(s), dopant material(s), and so forth. For example, to avoid overhead costs in retooling CMOS fabrication equipment, resistive-switching memory can often involve memory elements built on a Si wafer. Interconnecting the Si wafer and the memory elements can involve several layers of interconnects, often involving metals such as Aluminum (Al) or Copper (Cu). Due to relatively low softening temperatures of these metals, fabrication of the memory elements can be constrained to 450 degrees Celsius or lower (e.g., for Al interconnect technology).

In consideration of various aspects of the subject disclosure, the inventors have found that resistive switching memory cell technology can generally be small for an electronic memory cell, typically consuming silicon area on the order of $4F^2$ per adjacent resistive switching device, where F is the minimum feature size of a specific technology node (e.g., a memory cell comprising two resistive switching devices would therefore be approximately $8F^2$ if constructed in adjacent silicon space). Non-adjacent embodiments of the present disclosure, e.g., stacked above or below each other, can consume as little as $4F^2$ for a set of multiple non-adjacent devices. Such embodiments can lead to greater semiconductor component density and memory density, and low manufacturing costs for a given number of transistors relative to competing technologies. Embodiments of the present disclosure can also exhibit very fast programming and/or switching speed along with a relatively low programming current. Additional embodiments can provide non-volatile memory, having the capacity to store data without continuous application of power. In addition to the foregoing, some embodiments can generally be built between metal interconnect layers, enabling further embodiments that can be included within two-dimensional as well as three-dimensional semiconductor architectures.

To program one or more disclosed embodiments, a suitable program voltage can be applied across the memory cell causing a conductive filament to form through a resistive portion of the memory cell. This causes the memory cell to switch from a relatively high resistive state, to a relatively low resistive state. An erase process can be implemented to reverse the process, at least in part, causing the memory cell to return to approximately the high resistive state from the low resistive state. This change of state, in the context of memory, can be associated with respective states of a binary bit. Accordingly, multiple such memory cells can be programmed or erased to represent respective zeroes or ones of binary information, and by retaining those states over time in effect storing binary information. For various reasons, resistive switching memory cells are generally quick to program and responsive, changing state readily in response to a program or erase voltage. This quick switching of state is a significant advantage of various disclosed memory cells over other memory cell technologies.

One example of a conductive filament device is a three-layer memory cell arrangement of metal/amorphous silicon (a-Si) (also Silicon suboxide)/metal. This three-layer memory cell is an example of an a-Si resistive switching device. The a-Si layer essentially serves as a digital information storage medium. A resistive switching behavior is often characterized in terms of conductive filament formation inside an otherwise non-conductive a-Si material. This filament formation results from applying a positive voltage at metal layers on opposite sides of the a-Si material.

Although resistive switching devices based on the resistive switching principle have great technological promise, the inventors of the subject disclosure believe they can have some drawbacks as well. For instance, some metal/a-Si/metal devices form micron-sized filament structures, which can make sub-100 nanometer scale devices more difficult to achieve. Also, many metal/a-Si/metal structures require high current for filament formation. For instance, current as high as one hundred microamps or more are not un-common with such devices, greatly increasing power consumption for fundamental switching behavior. This has a negative impact on scaling; high current density can obviate close placement of conductive lines (e.g., twenty nm lines). In addition, filament formation can be difficult to control, and formation of a permanent conductive filament within the a-Si layer can destroy the switching capability of the device (e.g., essentially rendering the a-Si layer permanently conductive, and therefore incapable of switching from a low resistance state to a high resistance state). Viewed broadly, embodiments of the present disclosure have the potential to replace other types of memory existing in the marketplace due to the numerous advantages over competing technologies.

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIG. 1, memory device 100 is depicted. Memory device 100 can include a composite resistive layer for enhanced control of on-state current. For example, when two-terminal memory cells are programmed (by applying a program voltage across the terminals), a conductive filament extends through an associated resistive switching layer, in which case the cell is in a low resistance state. In this state, it is very difficult for some systems to control the current through the cell. Advantageously, the disclosed subject matter can mitigate such an issue.

Memory device 100 can include a substrate layer 102 and a two-terminal layer 104. In some embodiments, two-terminal layer 104 can be associated with a resistive-switching memory cell or device, an example of which can be a random access memory (RRAM) device or cell and substrate layer 102 can be associated with a complementary metal oxide semiconductor (CMOS) substrate. In some embodiments, layer 102 may have any number of CMOS-compatible devices formed therein or thereon, including logic, drivers of memory cell 100, or the like. As depicted, two-terminal memory layer 104 can include active metal layer 106, RSML 108, resistive layer 110, and ohmic contact layer 112. As noted above, active metal layer 106 can include filament forming ions that form the conductive filament in response to a voltage, an illustration of which can be found with reference to FIG. 3. In an on-state (e.g., after application of a program voltage), the conductive filament approximately spans the length of RSML 108. RSML 108 can be a single layer of switching material(s) or can comprise multiple layers, which is further discussed in connection with FIG. 3-4B.

Figure 2:
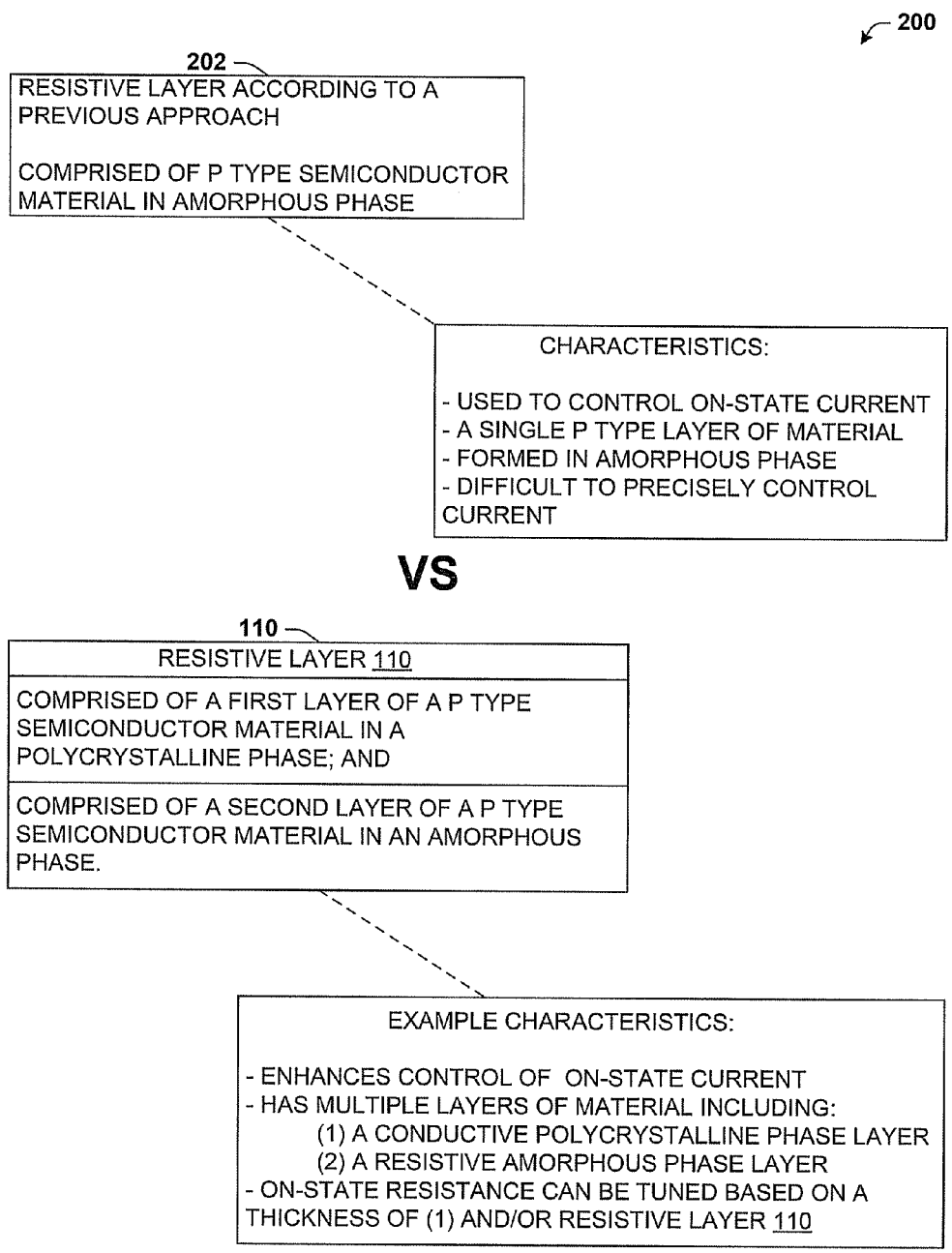
FIG. 2 depicts a diagram in which certain distinctions between current inventor approaches and prior inventor approaches are compared in connection with a resistive layer of the two-terminal memory in accordance with certain embodiments of this disclosure.

Further detail associated with resistive layer 110 and contact layer 112 can be found with reference to FIG. 2, which can now be reference in tandem with FIG. 1. FIG. 2 provides illustration 200 that depicts certain distinctions between various configurations of a two-terminal memory device. In particular, resistive layer 202 represents a two-terminal cell that is consistent with an approach that is distinct from the disclosed subject matter. Resistive layer 202 can be comprised of a p-type semiconductor material in an amorphous phase that acts as a series resistor to control the on-state current. In some embodiments, the amorphous phase is preferred by a manufacturer over a polycrystalline phase because the amorphous phase can maintain larger voltages and therefore provides for more reliable device operation, in some examples. In some configurations, it is difficult to precisely control current in an RSML (e.g., amorphous material, silicon sub-oxide), as further described with reference to FIG. 4A.

In various embodiments, resistive layer 110 can be comprised of multiple layers that in combination enable additional advantages over the previous approach. In particular, in some embodiments, resistive layer 110 can include a first semiconductor material in a polycrystalline phase (conductive) situated on top of a second semiconductor material in an amorphous phase (less conductive). In some embodiments, the second semiconductor material may have impurities (e.g., P-dopants), that may or may not be activated. Such a combination provides for enhanced control of on-state current. For example, the inventors have discovered that on-state resistance can be tuned based on a thickness of the first semiconductor material (and/or resistive layer 110), which is further detailed in connection with FIG. 4B.

Still referring to FIG. 1, in certain embodiments, two-terminal memory layer 102 can also include first metal layer 114 comprising a first electrical conductive material and second metal layer 116 comprising a second electrical conductive material. First metal layer 114 and second metal layer 116 can operate as a bottom electrode/terminal and a top electrode/terminal, respectively. In addition, oxide layer 118 can exist between two-terminal memory layer 104 and substrate layer 102. Thus, oxide layer 118 can, in some embodiments, be considered as part of substrate layer 102, while in other embodiments considered part of two-terminal memory layer 104 or viewed as or included in an independent layer (not shown). In some configurations, oxide layer 118 can be about 50 nanometers or more in thickness and generally thick enough for electrical isolation between two-terminal layer 104 (e.g., an RRAM portion) and substrate layer 102 (e.g., a CMOS portion). In some embodiments, diffusion or barrier materials may also be used between active metal layer 106 and RSML 108, such as titanium, titanium oxide, tungsten, titanium nitride, or the like. Additionally, a capping material may be deposited on top of second metal layer 116, such as titanium, titanium oxide, tungsten, titanium nitride, or the like.

Figure 3:
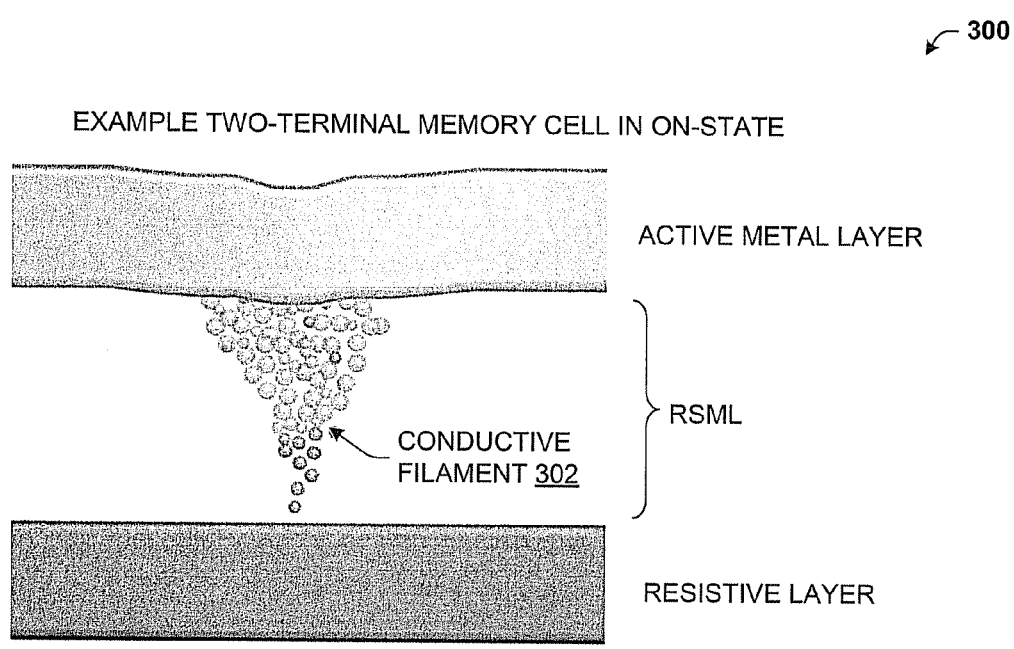
FIG. 3 is a graphical illustration depicting a cross-section of a portion of an example two-terminal memory cell in which a conductive filament has formed in accordance with certain embodiments of this disclosure.

Referring now to FIG. 3, a graphical illustration 300 is provided. Graphical illustration 300 depicts a cross-section of a portion of an example two-terminal memory cell in which a conductive filament has formed. For example, when a suitable program voltage (e.g., a positive voltage) or another suitable electric signal is applied across the terminals of the two-terminal memory cell, ions from the active metal layer move into the adjacent RSML, which is at least partially permeable to the ions that collectively form conductive filament 302. Conductive filament 302 can approximately span the thickness of the RSML, facilitating electrical conductivity through the RSML. When the program voltage is applied and conductive filament 302 forms, the memory cell is said to be in the on-state, which is a low-resistance state. In response to a suitable erase voltage (e.g., a negative voltage), conductive filament 302 can at least in part deform or retract, breaking the electrical conductive path. Such is a high-resistance state, associated with an off-state. In some embodiments, the length of the conductive filament 302 formed in RSML affects the sensed resistance of the memory. Accordingly, in various embodiments, more than one resistance state may be stored and read from the memory cell.

Figure 4A:
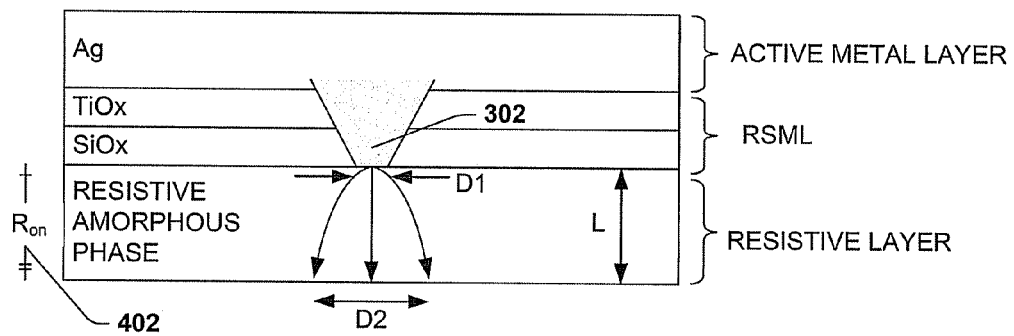
FIG. 4A depicts an example system illustrating on-state resistance of a two-terminal memory device in accordance with a previous approach.

Turning now to FIG. 4A, device 400 provides additional detail in connection with on-state resistance of a device illustrated in FIG. 2 that is in accordance with a previous approach. As illustrated, conductive filament 302 has formed (e.g., the cell is in the on-state), approximately spanning the length of the RSML to make contact with the resistive layer (amorphous material). In one example, at the point of contact with the resistive layer, the width of filament 302 is approximately 10 nanometers or less, which is tantamount to point contact. This width is denoted as D1.

In various configurations, because D1 has relatively small dimensions, the on-state resistance 402, labeled $R_{on}$, through the resistive layer is governed by D1. In various configurations, it is noted that the thickness of the resistive layer, L, typically must be greater than approximately 20 nanometers in order to avoid electrical breakdown. Thus, the resistivity of the resistive layer is relatively large due to its amorphous phase, but this resistivity of the resistive layer cannot be reduced.

For example, on-state resistance 402 can be characterized to the first order as:

$$Ron \approx \rho \int_0^L \frac{dx}{\pi\left(\left(\frac{D2-D1}{L}x+D1\right)/2\right)^2}$$

where, $\rho$ is the resistivity of the resistive layer. Accordingly, although the role of the resistive layer is to control the current (via inherent resistivity) in the on-state, there are hard limits to the ability to perform this task.

Figure 4B:
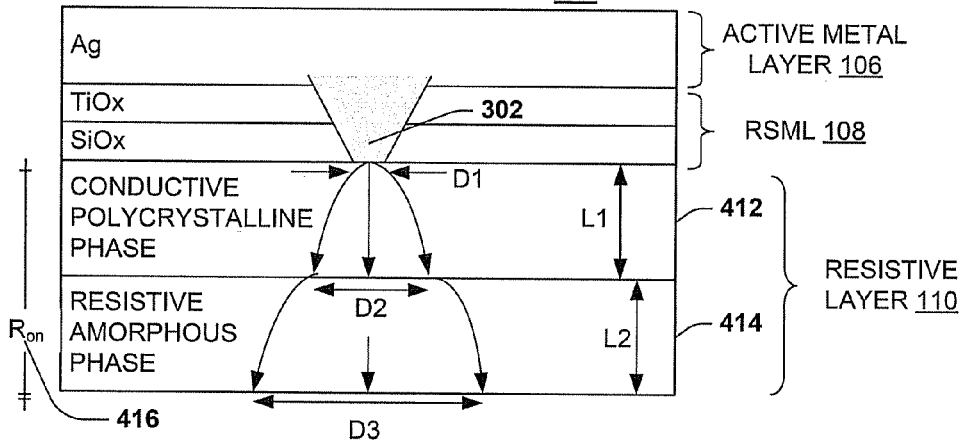
FIG. 4B depicts an example system illustrating on-state resistance for some embodiments of the disclosed subject matter.

In contrast, consider the FIG. 4B. Device 410 of FIG. 4B provides an example of on-state resistance for embodiments of the disclosed subject matter. In particular, on-state resistance for resistive layer 110. Similar to device 400, in this non-limiting example, the active metal layer is composed of silver, and RSML 108 is composed two distinct layers. The first sub-layer of RSML 108 is composed of titanium oxide and can be from about 1 to about 20 nanometers in thickness.

In some embodiments, the first sub-layer of RSML 108 is a passivation layer and can provide an oxygen diffusion barrier, and a second sub-layer of RSML 108 is composed of a resistive switching media (e.g., silicon oxide amorphous silicon-bearing material) and can be from about 2 to about 10 nanometers in thickness.

As was shown in the device 400, conductive filament 302 is formed in the switching media layer when a program voltage is applied to the device. In some cases, the conductive filament 302 extends from active metal layer 106, and may partially or completely span RSML 108. In the example in FIG. 4A, conductive filament 302 is illustrated contacting a resistive layer in an amorphous phase (e.g., the single-layer composition illustrated). However, in the example in FIG. 4B, resistive layer 110 is multilayered, comprising first semiconductor layer 412 in a polycrystalline phase (e.g., conductive) situated above second semiconductor material 414 in an amorphous phase (e.g., resistive). In some embodiments, first semiconductor layer 412 can be a p-type conductive semiconductor material comprising polycrystalline silicon germanium (SiGe), or other polycrystalline p-doped silicon-bearing layer. Second semiconductor material 414 can be a p-type resistive semiconductor material comprising amorphous SiGe. Other suitable materials or phases can be employed as well, for example, in some embodiments second semiconductor material 414 may be undoped.

In this example, conductive filament 302 contacts the conductive first semiconductor layer 412 that can provide for precise tuning of on-state resistance 416 and/or on-state current through device 410. For example, in the case of device 410, on-state resistance to the first order can be modeled according to the following:

$$Ron \approx \rho_1 \int_0^{L1} \frac{dx}{\pi\left(\left(\frac{D2-D1}{L1}x+D1\right)/2\right)^2} + \rho_2 \int_0^{L2} \frac{dx}{\pi\left(\left(\frac{D3-D2}{L2}x+D2\right)/2\right)^2}$$

Where $\rho_1$ is the resistivity of first semiconductor layer 412 and $\rho_2$ is the resistivity of second semiconductor material 414. Accordingly, L1, the thickness of first semiconductor layer 412, can be a significant means of affecting and/or controlling on-state resistance 416. In particular, as L1 is reduced, then on-state resistance 416 will tend to increase (and the on-state current will therefore decrease), whereas when L1 is enlarged, on-state resistance 416 will tend to decrease (and on-state current will see an attendant increase). Hence, on-state resistance 416 as well as an associated on-state current can be effectively tuned by manipulating L1, the thickness of first semiconductor layer 412, which is illustrated in connection with FIG. 5.

Figure 5:
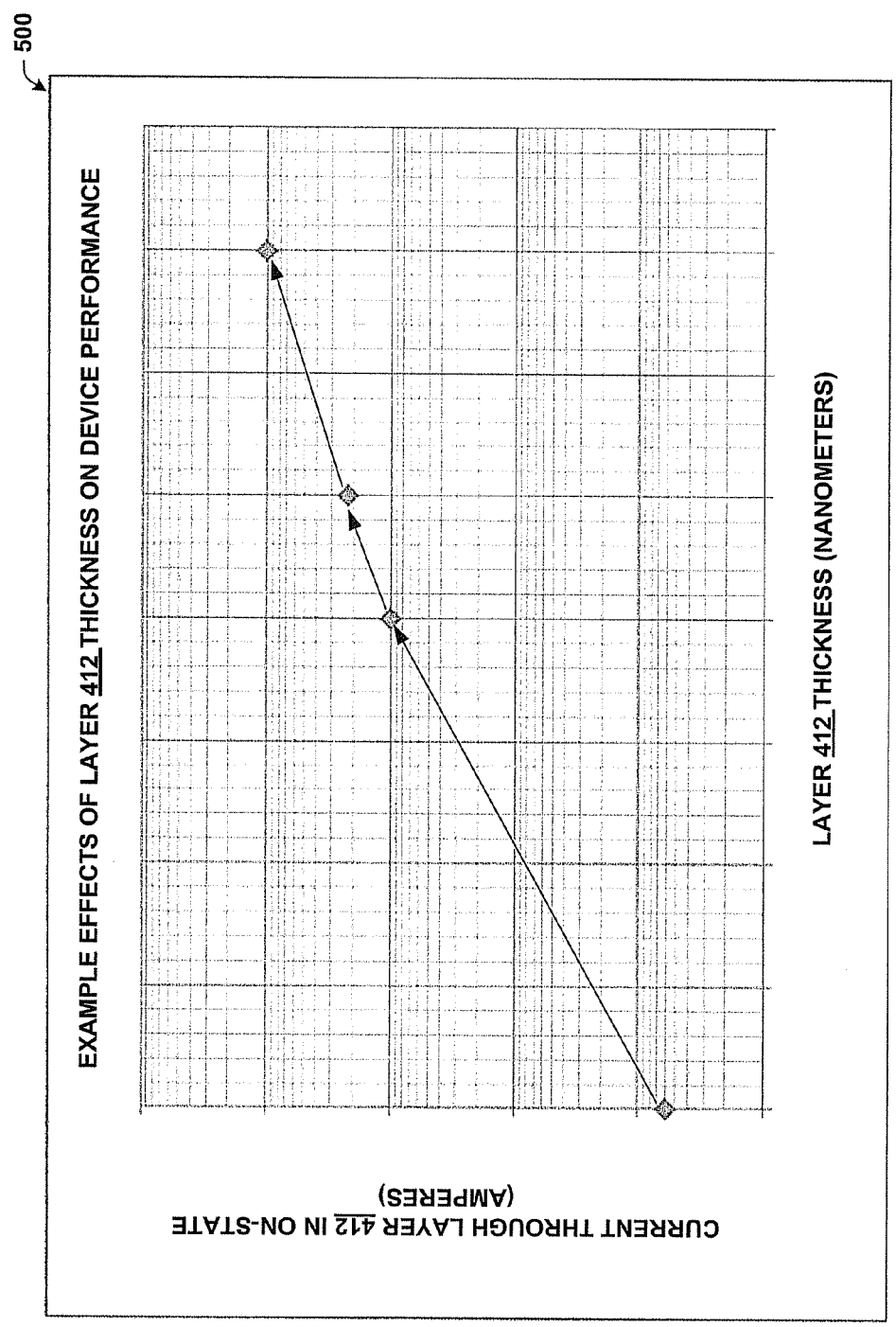
FIG. 5 illustrates a graph of example effects of the first semiconductor layer thickness on the performance of the device in accordance with certain embodiments of this disclosure.

While still referring to FIG. 4B, but turning also to FIG. 5, graph 500 is illustrated. Graph 500 depicts example effects of first semiconductor layer 412 thickness on device 410 performance, specifically first semiconductor layer 412 thickness versus on-state current. As can be seen, if first semiconductor layer 412 is not present (e.g., L1=0), then on-state current is at the upper limit that can be provided by a single layer in the amorphous phase (e.g., the limit attainable in previous devices). However, by introducing first semiconductor layer 412, on-state current rises dramatically (and on-state resistance 416 decreases significantly) as the thickness of first semiconductor layer 412 (e.g., L1) increases.

In some embodiments, the thickness of first semiconductor layer 412 (e.g., L1) can range between about 5 nanometers and about 50 nanometers, while a thickness of second semiconductor material 414 (e.g., L2) can range between about 20 nanometers and about 200 nanometers. In such embodiments, a resistivity of first semiconductor layer 412 (e.g., $\rho_1$) can be between about 0.001 ohm-centimeters and about 0.5 ohm-centimeters, whereas a resistivity of second semiconductor material 414 (e.g., $\rho_2$) can range from about 5 ohm-centimeters to about 50 ohm-centimeters. Such can provide the ability to tune on-state current from approximately 100 nanoamperes to about 100 microamperes.

Figure 6:
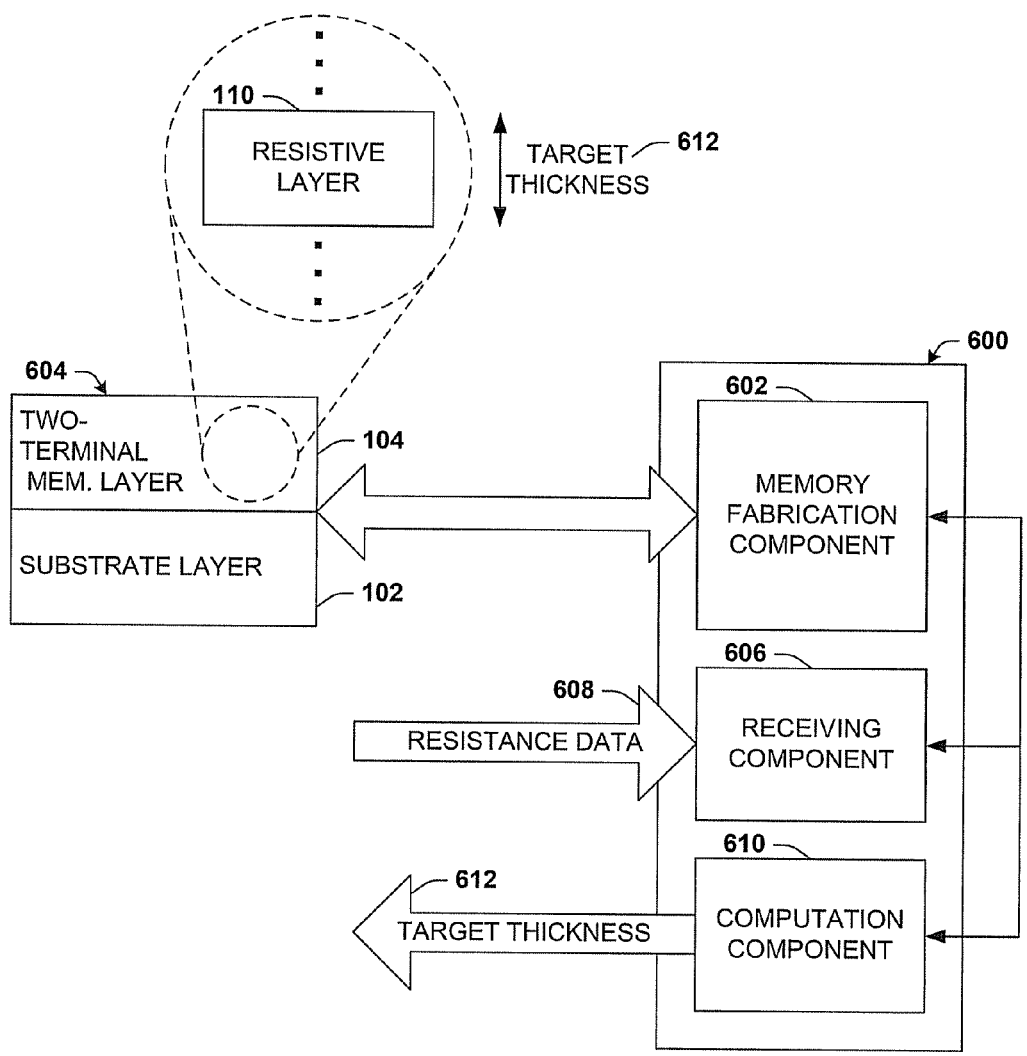
FIG. 6 illustrates an example system that provides for enhanced tuning of on-state resistance in connection with a resistive layer of two-terminal memory device in accordance with certain embodiments of this disclosure.

With reference now to FIG. 6, system 600 is illustrated. System 600 can, inter alia, provide for enhanced tuning of on-state resistance in connection with a resistive layer of a two-terminal memory device. System 600 can include a memory that stores computer executable components and a processor that executes computer executable components stored in the memory, examples of which can be found with reference to FIG. 11. It is to be appreciated that the computer 1102 can be used in connection with implementing one or more of the systems or components shown and described in connection with FIG. 6 or other figures disclosed herein. As depicted, system 600 can include a memory fabrication component 602, a receiving component 606, and a computation component 610.

Memory fabrication component 602 can be configured to facilitate fabrication of memory device 604, which in some embodiments can be similar or identical to memory device 100 of FIG. 1. Hence, memory device 604 can include substrate layer 102 (e.g., CMOS) and two-terminal memory layer 104 (e.g., RRAM), as substantially described herein. For example, two-terminal memory layer 104 can include resistive layer 110, which can be varied in order to provide desired characteristics associated with memory device 604.

Receiving component 606 can be configured to receive resistance data 608. Resistance data 608 can include a target on-state resistance for resistive layer 110 included in two-terminal memory layer 104. Additionally or alternatively, resistance data 608 can include a target on-state current for resistive layer 110 in connection with defined operating voltages for memory device 604 in operation.

Computation component 610 can be configured to determine target thickness 612 of resistive layer 612 and/or a particular portion of resistive layer 612. Computation component 610 can determine target thickness 612 as a function of resistance data 608, which is further detailed in connection with FIG. 7.

Figure 7:
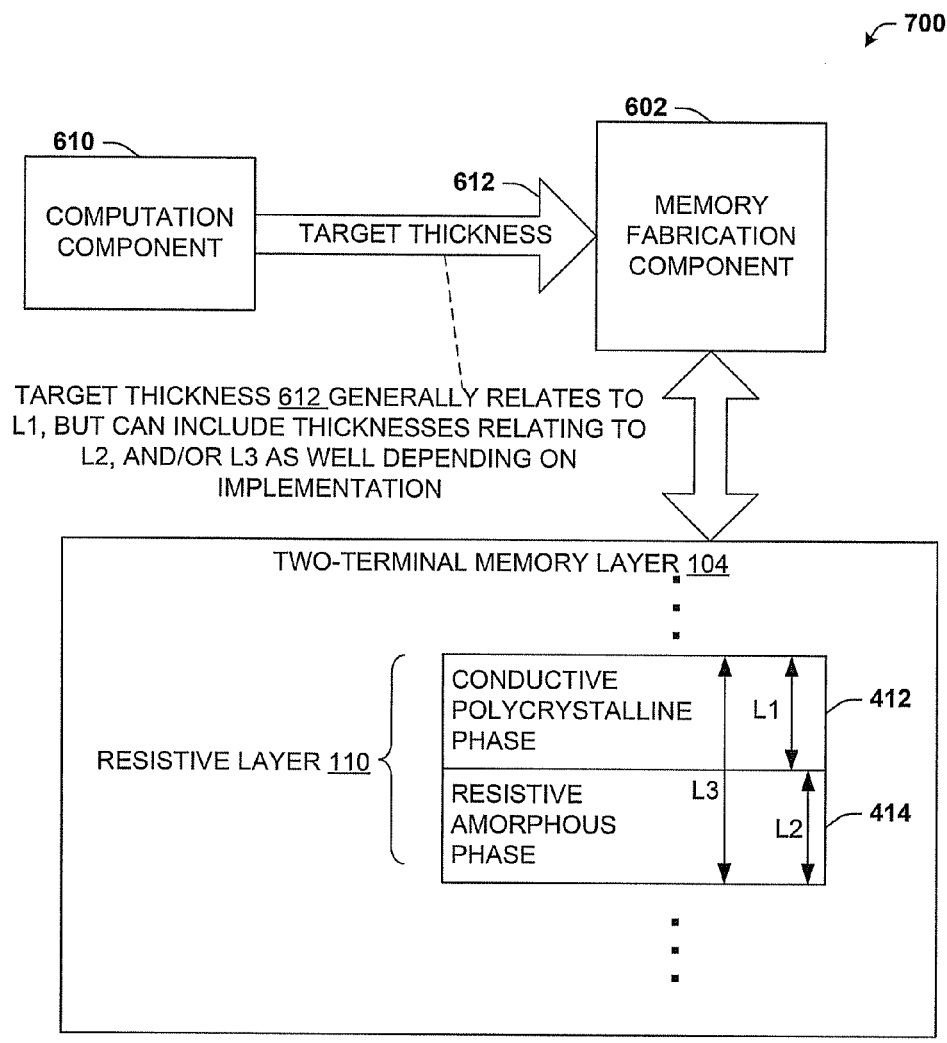
FIG. 7 illustrates an example system that provides for addition detail or features in connection with enhanced tuning of on-state resistance in accordance with certain embodiments of this disclosure.

Now turning to FIG. 7, system 700 provides for addition detail or features in connection with enhanced tuning of on-state resistance. As depicted, resistive layer 110 can comprise multiple layers, specifically, a conductive semiconductor material in a polycrystalline phase labeled layer 412; and a resistive semiconductor material in an amorphous phase, denoted layer 414. The thickness of layer 412 is represented by L1, the thickness of layer 414 is represented by L2, and the combination and/or the entire thickness of resistive layer 110 is represented by L3.

Memory fabrication component 602 can receive target thickness 612 (e.g., from computation component 610) prior to fabricating all or a portion of two-terminal memory layer 104. In some embodiments target thickness 612 can relate specifically to L1. Other embodiments exist in which target thickness 612 and/or resistance data 608 can relate to other features of resistive layer 110 such as L2 or L3.

Example Method for Fabricating a Two-Terminal Memory Device with Composite Resistive Layer for Tuning on-State Current The aforementioned diagrams have been described with respect to interaction between several components, or memory architectures. It should be appreciated that such diagrams can include those components and architectures specified therein, some of the specified components/architectures, and/or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of disclosed memory architectures can be erased in groups (e.g., multiple rows erased concurrently) or individually. Moreover, it should be appreciated that multiple two-terminal memory cells on a particular row can be programmed in groups (e.g., multiple two-terminal memory cells programmed concurrently) or individually. Components of the disclosed architectures can also interact with one or more other components not specifically described herein but known by those of skill in the art.

Figure 8:
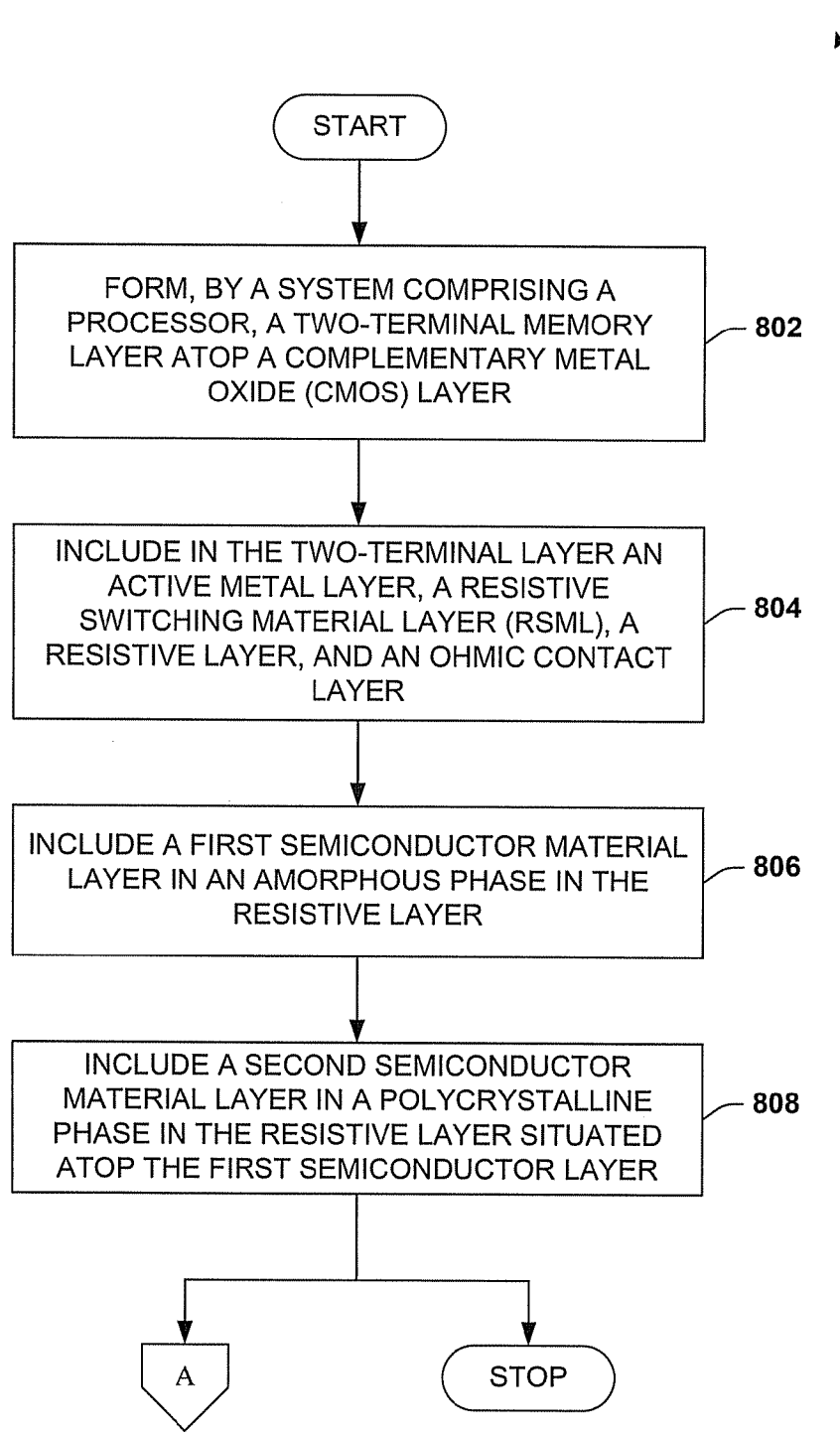
FIG. 8 illustrates an example methodology that can provide for fabricating a two-terminal memory portion of a memory device with a composite resistive layer in accordance with certain embodiments of this disclosure.
Figure 9:
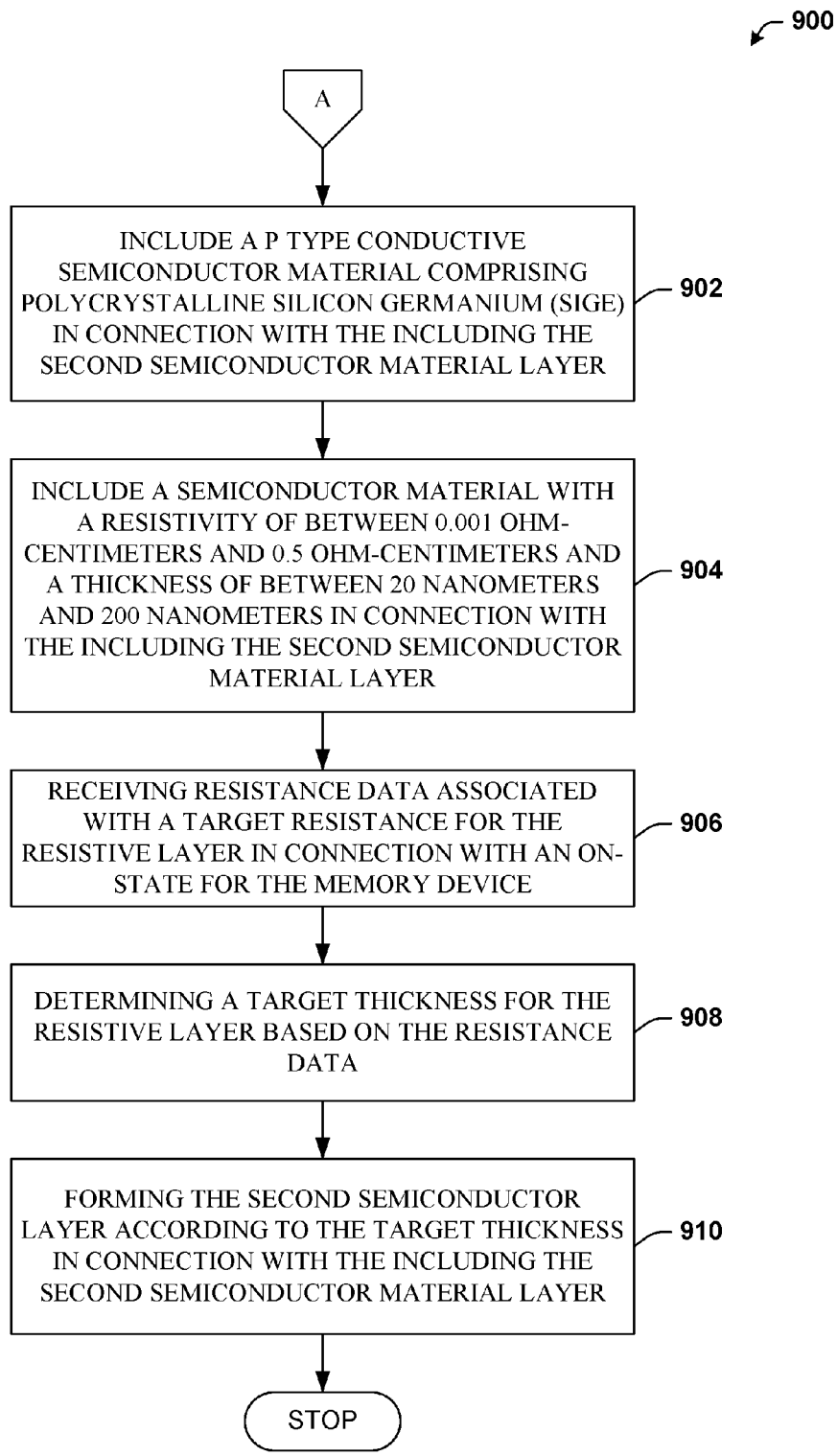
FIG. 9 illustrates an example methodology that can provide for additional features or aspects in connection with fabricating the two-terminal memory portion of a memory device with a composite resistive layer for enhanced on-state current tuning characteristics in accordance with certain embodiments of this disclosure.

In view of the exemplary diagrams described supra, process methods that can be implemented in accordance with the disclosed subject matter will be better appreciated with reference to the flow chart of FIGS. 8 and 9. While for purposes of simplicity of explanation, the method of FIGS. 8 and 9 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 8 illustrates exemplary method 800. Method 800 can provide for fabricating a two-terminal memory portion of a memory device with a composite resistive layer. The two-terminal memory portion fabricated according to method 800 can exhibit enhanced tuning characteristics for on-state current and/or resistance. For example, at reference numeral 802, formation of a two-terminal memory layer (e.g., RRAM) atop a substrate layer (e.g., CMOS) can be facilitated. It is understood that the layers included at reference numeral 802 as well as other reference numerals detailed herein can be performed by or facilitated by a system including a processor, an example of which can be found with reference to FIG. 11.

At reference numeral 804, inclusion of an active metal layer, an RSML, a resistive layer, and an ohmic contact layer can be facilitated in the substrate layer. At reference numeral 806, inclusion of a first semiconductor material layer in an amorphous phase can be facilitated in the resistive layer. At reference numeral 808, inclusion of a second semiconductor material layer in a polycrystalline phase can be facilitated in the resistive layer situated atop the first semiconductor layer. It is therefore noted, the resistive layer can be comprised of composite layer, a polycrystalline layer and an amorphous layer.

With reference now to FIG. 9, example method 900 is depicted. Method 900 can provide for additional features or aspects in connection with fabricating a two-terminal memory portion of a memory device with a composite resistive layer for enhanced on-state current tuning characteristics. For example, as detailed in connection with reference numeral 806 of FIG. 8, a second semiconductor layer can be included in the fabrication of the memory device. In some embodiments, such can comprise inclusion of a p-type conductive semiconductor material comprising polycrystalline SiGe, as described at reference numeral 902.

At reference numeral 904, the second semiconductor layer can be fabricated by inclusion of a semiconductor material with a resistivity of between 0.001 ohm-centimeters and 0.5 ohm-centimeters and a thickness of between 20 nanometers and 200 nanometers.

At reference numeral 906, resistance data associated with a target resistance for the resistive layer can be received. At reference numeral 908, a target thickness for the resistive layer can be determined based on the resistance data received at reference numeral 906. At reference numeral 910, the second semiconductor layer can be formed according to the target thickness in connection with the facilitating inclusion of the second semiconductor material layer detailed at reference numeral 806.

Example Operating Environments

Figure 10:
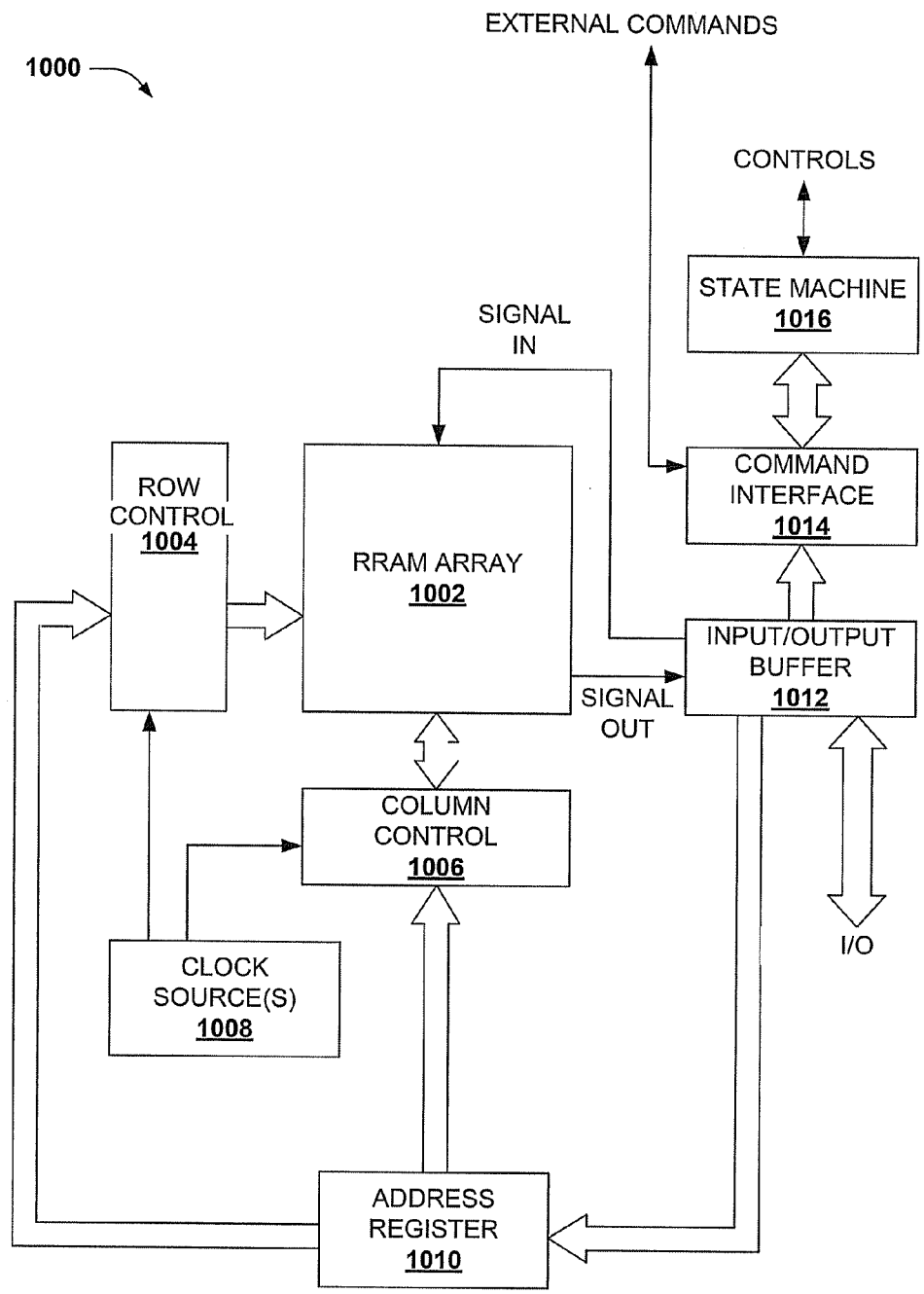
FIG. 10 illustrates a block diagram of an example electronic operating environment in accordance with certain embodiments of this disclosure.

In order to provide a context for the various aspects of the disclosed subject matter, FIG. 10, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules or devices.

FIG. 10 illustrates a block diagram of an example operating and control environment 1000 for a RRAM array 1002 according to aspects of the subject disclosure. In at least one aspect of the subject disclosure, RRAM array 1002 can comprise a variety of RRAM memory cell technology. Particularly, RRAM array can be configured or operated to mitigate or avoid sneak path currents of the RRAM array, as described herein.

A column controller 1006 can be formed adjacent to RRAM array 1002. Moreover, column controller 1006 can be electrically coupled with bit lines of RRAM array 1002. Column controller 1006 can control respective bitlines, applying suitable program, erase or read voltages to selected bitlines.

In addition, operating and control environment 1000 can comprise a row controller 1004. Row controller 1004 can be formed adjacent to column controller 1006, and electrically connected with word lines of RRAM array 1002. Row controller 1004 can select particular rows of memory cells with a suitable selection voltage. Moreover, row controller 1004 can facilitate program, erase or read operations by applying suitable voltages at selected word lines.

A clock source(s) 1008 can provide respective clock pulses to facilitate timing for read, write, and program operations of row control 1004 and column control 1006. Clock source(s) 1008 can further facilitate selection of word lines or bit lines in response to external or internal commands received by operating and control environment 1000. An input/output buffer 1012 can be connected to an external host apparatus, such as a computer or other processing device (not depicted) by way of an I/O buffer or other I/O communication interface. Input/output buffer 1012 can be configured to receive write data, receive an erase instruction, output readout data, and receive address data and command data, as well as address data for respective instructions. Address data can be transferred to row controller 1004 and column controller 1006 by an address register 1010. In addition, input data is transmitted to RRAM array 1002 via signal input lines, and output data is received from RRAM array 1002 via signal output lines. Input data can be received from the host apparatus, and output data can be delivered to the host apparatus via the I/O buffer.

Commands received from the host apparatus can be provided to a command interface 1014. Command interface 1014 can be configured to receive external control signals from the host apparatus, and determine whether data input to the input/output buffer 1012 is write data, a command, or an address. Input commands can be transferred to a state machine 1016.

State machine 1016 can be configured to manage programming and reprogramming of RRAM array 1002. State machine 1016 receives commands from the host apparatus via input/output interface 1012 and command interface 1014, and manages read, write, erase, data input, data output, and like functionality associated with RRAM array 1002. In some aspects, state machine 1016 can send and receive acknowledgments and negative acknowledgments regarding successful receipt or execution of various commands.

To implement read, write, erase, input, output, etc., functionality, state machine 1016 can control clock source(s) 1008. Control of clock source(s) 1008 can cause output pulses configured to facilitate row controller 1004 and column controller 1006 implementing the particular functionality. Output pulses can be transferred to selected bit lines by column controller 1006, for instance, or word lines by row controller 1004, for instance.

In connection with FIG. 11, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 11:
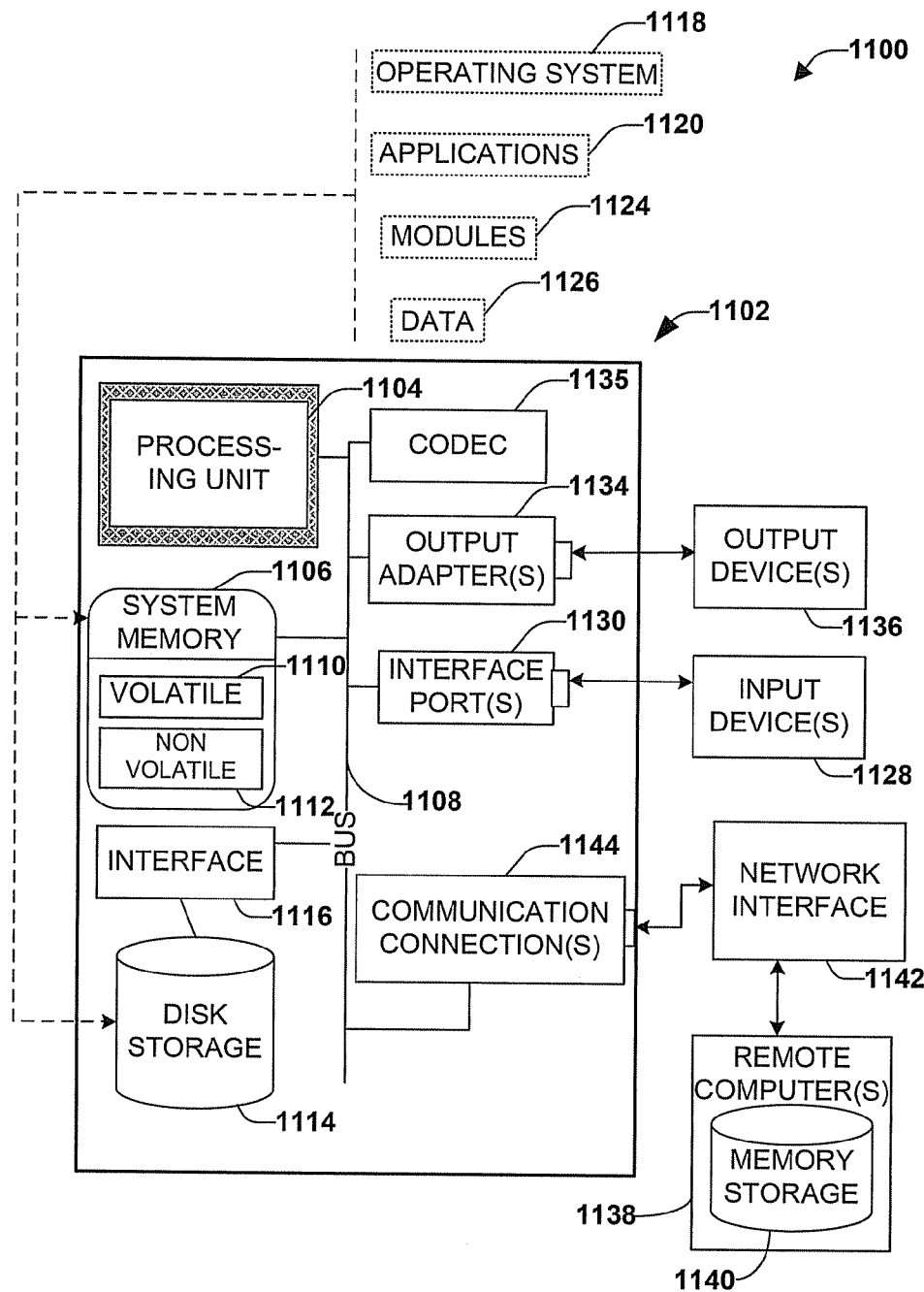
FIG. 11 illustrates an example schematic block diagram for a computing environment in accordance with certain embodiments of this disclosure.

With reference to FIG. 11, a suitable environment 1100 for implementing various aspects of the claimed subject matter includes a computer 1102. The computer 1102 includes a processing unit 1104, a system memory 1106, a codec 1135, and a system bus 1108. The system bus 1108 couples system components including, but not limited to, the system memory 1106 to the processing unit 1104. The processing unit 1104 can be any of various available processors. Dual microprocessors and other multiprocessor architectures also can be employed as the processing unit 1104.

The system bus 1108 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1106 includes volatile memory 1110 and non-volatile memory 1112. The basic input/output system (BIOS), containing the basic routines to transfer information between elements within the computer 1102, such as during start-up, is stored in non-volatile memory 1112. In addition, according to present innovations, codec 1135 may include at least one of an encoder or decoder, wherein the at least one of an encoder or decoder may consist of hardware, software, or a combination of hardware and software. Although, codec 1135 is depicted as a separate component, codec 1135 may be contained within non-volatile memory 1112. By way of illustration, and not limitation, non-volatile memory 1112 can include read only memory (ROM), programmable ROM (PROM), electrically programmable ROM (EPROM), electrically erasable programmable ROM (EEPROM), or flash memory. Volatile memory 1110 includes random access memory (RAM), which acts as external cache memory. According to present aspects, the volatile memory may store the write operation retry logic (not shown in FIG. 11) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 1102 may also include removable/non-removable, volatile/non-volatile computer storage medium. FIG. 11 illustrates, for example, disk storage 1114. Disk storage 1114 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1114 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1114 to the system bus 1108, a removable or non-removable interface is typically used, such as interface 1116. It is appreciated that storage devices 1114 can store information related to a user. Such information might be stored at or provided to a server or to an application running on a user device. In one embodiment, the user can be notified (e.g., by way of output device(s) 1136) of the types of information that are stored to disk storage 1114 and/or transmitted to the server or application. The user can be provided the opportunity to opt-in or opt-out of having such information collected and/or shared with the server or application (e.g., by way of input from input device(s) 1128).

It is to be appreciated that FIG. 11 describes software that acts as an intermediary between users and the basic computer resources described in the suitable operating environment 1100. Such software includes an operating system 1118. Operating system 1118, which can be stored on disk storage 1114, acts to control and allocate resources of the computer system 1102. Applications 1120 take advantage of the management of resources by operating system 1118 through program modules 1124, and program data 1126, such as the boot/shutdown transaction table and the like, stored either in system memory 1106 or on disk storage 1114. It is to be appreciated that the claimed subject matter can be implemented with various operating systems or combinations of operating systems.

A user enters commands or information into the computer 1102 through input device(s) 1128. Input devices 1128 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1104 through the system bus 1108 via interface port(s) 1130. Interface port(s) 1130 include, for example, a serial port, a parallel port, a game port, and a universal serial bus (USB). Output device(s) 1136 use some of the same type of ports as input device(s) 1128. Thus, for example, a USB port may be used to provide input to computer 1102 and to output information from computer 1102 to an output device 1136. Output adapter 1134 is provided to illustrate that there are some output devices 1136 like monitors, speakers, and printers, among other output devices 1136, which require special adapters. The output adapters 1134 include, by way of illustration and not limitation, video and sound cards that provide a means of connection between the output device 1136 and the system bus 1108. It should be noted that other devices and/or systems of devices provide both input and output capabilities such as remote computer(s) 1138.

Computer 1102 can operate in a networked environment using logical connections to one or more remote computers, such as remote computer(s) 1138. The remote computer(s) 1138 can be a personal computer, a server, a router, a network PC, a workstation, a microprocessor based appliance, a peer device, a smart phone, a tablet, or other network node, and typically includes many of the elements described relative to computer 1102. For purposes of brevity, only a memory storage device 1140 is illustrated with remote computer(s) 1138. Remote computer(s) 1138 is logically connected to computer 1102 through a network interface 1142 and then connected via communication connection(s) 1144. Network interface 1142 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1144 refers to the hardware/software employed to connect the network interface 1142 to the bus 1108. While communication connection 1144 is shown for illustrative clarity inside computer 1102, it can also be external to computer 1102. The hardware/software necessary for connection to the network interface 1142 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, ... ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips ... ), optical disks (e.g., compact disk (CD), digital versatile disk (DVD) ... ), smart cards, and flash memory devices (e.g., card, stick, key drive ... ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for fabricating a memory device, comprising:
    forming a two-terminal memory layer above a substrate layer;
    including in the two-terminal memory layer an ohmic contact layer above the substrate layer, a resistive layer above the ohmic contact layer, a resistive switching material (RSM) layer above the resistive layer, and an active metal layer above the RSM layer;
    including a first semiconductor material layer in an amorphous phase in the resistive layer; and
    including a second semiconductor material layer in a polycrystalline phase in the resistive layer situated above the first semiconductor layer.

2. The method of claim 1, further comprising forming the second semiconductor material layer from a p-type conductive semiconductor material comprising polycrystalline silicon germanium (SiGe).

3. The method of claim 1, further comprising forming the second semiconductor material with a resistivity in a range of about 0.001 ohm-centimeters to about 0.5 ohm-centimeters.

4. The method of claim 3, further comprising forming the second semiconductor material with a thickness in a range of about 5 nanometers to about 50 nanometers.

5. The method of claim 1, further comprising receiving a resistance data associated with a target resistance for the resistive layer.

6. The method of claim 5, further comprising determining from the resistance data a thickness value for the resistive layer associated with the target resistance.

7. The method of claim 6, further comprising forming the second semiconductor material layer with a thickness equal to the thickness value.

8. The method of claim 1, further comprising forming the RSM layer from an undoped amorphous silicon material or a silicon sub-oxide material.

9. The method of claim 1, further comprising forming the RSM layer from a titanium oxide material.

10. The method of claim 1, further comprising forming the RSM layer from a silicon oxide layer.

11. The method of claim 1, further comprising forming the RSM layer from a first sub-layer comprising a titanium oxide material, and from a second sub-layer adjacent to the first sub-layer comprising a silicon sub-oxide material.

12. The method of claim 1, further comprising forming a barrier layer adjacent to the RSM layer and the active metal layer, wherein the barrier layer comprises at least one of titanium, titanium oxide, tungsten, or titanium nitride.

13. The method of claim 1, further comprising: forming the first semiconductor material and the second semiconductor material at a temperature that is within a thermal budget of a complementary metal oxide semiconductor device formed at least in part within the substrate layer.

14. The method of claim 13, further comprising forming the first semiconductor material and the second semiconductor material at a temperature equal to or below about 450° C.

15. The method of claim 1, further comprising forming the second semiconductor material in physical contact with the RSM layer.

16. A method of fabricating a non-volatile memory, comprising:
    providing a substrate having a complementary metal oxide semiconductor (CMOS) device within the substrate;
    forming a dielectric layer over the substrate;
    forming a first metal layer over the dielectric layer;
    forming a resistive layer over the first metal layer, wherein forming the resistive layer further comprises forming an amorphous phase material overlying the first metal layer and forming a polycrystalline phase material overlying the amorphous phase material;
    forming a resistive switching material (RSM) layer over the resistive layer; and
    forming an active metal layer over the RSM layer.

17. The method of claim 16, further comprising forming the non-volatile memory within a thermal budget of the CMOS device.

18. The method of claim 16, further comprising forming the RSM layer adjacent to the crystalline phase material.

19. The method of claim 16, wherein forming the resistive layer further comprises forming the amorphous phase material and the polycrystalline phase material, respectively, as a p-type semiconductor material.

20. The method of claim 16, further comprising at least one of:
    forming the amorphous phase material with a resistivity within a range between about 5 ohm-centimeters and about 50 ohm-centimeters; or
    forming the polycrystalline phase material with a second resistivity within a second range between about 0.001 ohm-centimeters and about 0.5 ohm-centimeters.

* * * * *